United States Patent
Sultan et al.

(10) Patent No.: US 8,426,278 B2
(45) Date of Patent: Apr. 23, 2013

(54) SEMICONDUCTOR DEVICES HAVING STRESSOR REGIONS AND RELATED FABRICATION METHODS

(75) Inventors: Akif Sultan, Austin, TX (US); Indradeep Sen, Austin, TX (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 254 days.

(21) Appl. No.: 12/797,420

(22) Filed: Jun. 9, 2010

(65) Prior Publication Data

US 2011/0303980 A1   Dec. 15, 2011

(51) Int. Cl.
H01L 21/00 (2006.01)
(52) U.S. Cl.
USPC ............ 438/285; 438/308; 438/155
(58) Field of Classification Search .......... 438/285, 438/308, 155
See application file for complete search history.

(56) References Cited

U.S. PATENT DOCUMENTS

| | | | |
|---|---|---|---|
| 7,432,167 B2 * | 10/2008 | Hsieh ............. | 438/300 |
| 7,449,753 B2 * | 11/2008 | Wang et al. ............. | 257/369 |
| 7,504,270 B2 * | 3/2009 | Wu et al. ............. | 438/17 |
| 7,582,493 B2 * | 9/2009 | Sultan et al. ............. | 438/18 |
| 7,592,675 B2 * | 9/2009 | Liaw ............. | 257/371 |
| 7,612,364 B2 * | 11/2009 | Chuang et al. ............. | 257/19 |
| 7,633,103 B2 * | 12/2009 | Sultan et al. ............. | 257/288 |
| 7,718,500 B2 * | 5/2010 | Chong et al. ............. | 438/300 |
| 7,727,870 B2 * | 6/2010 | Zhang et al. ............. | 438/589 |
| 7,736,957 B2 * | 6/2010 | Grudowski et al. ............. | 438/153 |
| 7,750,416 B2 * | 7/2010 | Lee et al. ............. | 257/391 |
| 7,786,518 B2 * | 8/2010 | Chakravarthi et al. ............. | 257/288 |
| 7,793,240 B2 * | 9/2010 | Sultan et al. ............. | 716/136 |
| 7,816,686 B2 * | 10/2010 | Pan et al. ............. | 257/65 |
| 7,833,861 B2 * | 11/2010 | Choi ............. | 438/270 |
| 7,846,812 B2 * | 12/2010 | Hill ............. | 438/424 |
| 7,939,413 B2 * | 5/2011 | Chong et al. ............. | 438/300 |
| 7,947,546 B2 * | 5/2011 | Liu et al. ............. | 438/197 |
| 8,003,467 B2 * | 8/2011 | Ng et al. ............. | 438/285 |
| 8,008,157 B2 * | 8/2011 | Liang et al. ............. | 438/300 |
| 8,017,473 B2 * | 9/2011 | Lee et al. ............. | 438/231 |
| 8,048,752 B2 * | 11/2011 | Wu et al. ............. | 438/301 |
| 8,058,123 B2 * | 11/2011 | Liu et al. ............. | 438/230 |
| 8,067,799 B2 * | 11/2011 | Choi ............. | 257/330 |
| 8,076,703 B2 * | 12/2011 | Sultan et al. ............. | 257/288 |
| 2004/0031772 A1 * | 2/2004 | Chang et al. ............. | 216/8 |
| 2004/0137373 A1 * | 7/2004 | Lei et al. ............. | 430/313 |
| 2006/0030093 A1 * | 2/2006 | Zhang et al. ............. | 438/197 |
| 2006/0124988 A1 * | 6/2006 | Hur et al. ............. | 257/315 |
| 2006/0194387 A1 * | 8/2006 | Wang et al. ............. | 438/257 |
| 2007/0018236 A1 * | 1/2007 | Tsuchiaki ............. | 257/324 |
| 2007/0020864 A1 * | 1/2007 | Chong et al. ............. | 438/300 |
| 2007/0026599 A1 * | 2/2007 | Peidous et al. ............. | 438/199 |
| 2007/0176235 A1 * | 8/2007 | Tsujiuchi et al. ............. | 257/347 |
| 2007/0190730 A1 * | 8/2007 | Huang et al. ............. | 438/299 |

(Continued)

*Primary Examiner* — Laura Menz (74) *Attorney, Agent, or Firm* — Ingrassia Fisher & Lorenz, P.C.

(57) ABSTRACT

Apparatus for semiconductor device structures and related fabrication methods are provided. A method for fabricating a semiconductor device structure on an isolated region of semiconductor material comprises forming a plurality of gate structures overlying the isolated region of semiconductor material and masking edge portions of the isolated region of semiconductor material. While the edge portions are masked, the fabrication method continues by forming recesses between gate structures of the plurality of gate structures and forming stressor regions in the recesses. The method continues by unmasking the edge portions and implanting ions of a conductivity-determining impurity type into the stressor regions and the edge portions.

7 Claims, 11 Drawing Sheets

U.S. PATENT DOCUMENTS

| | | | | |
|---|---|---|---|---|
| 2007/0235817 | A1* | 10/2007 | Wang et al. | 257/392 |
| 2007/0257308 | A1* | 11/2007 | Lee et al. | 257/334 |
| 2007/0290192 | A1* | 12/2007 | Rotondaro | 257/19 |
| 2007/0298524 | A1* | 12/2007 | Wu et al. | 438/14 |
| 2008/0042123 | A1* | 2/2008 | Thei et al. | 257/19 |
| 2008/0085570 | A1* | 4/2008 | Sultan et al. | 438/14 |
| 2008/0104550 | A1* | 5/2008 | Sultan et al. | 716/2 |
| 2008/0105932 | A1* | 5/2008 | Liaw | 257/401 |
| 2008/0157191 | A1* | 7/2008 | Choi | 257/330 |
| 2008/0246057 | A1* | 10/2008 | Lin et al. | 257/190 |
| 2008/0261362 | A1* | 10/2008 | Zhang et al. | 438/230 |
| 2008/0303062 | A1* | 12/2008 | Mimura et al. | 257/190 |
| 2009/0057729 | A1* | 3/2009 | Sultan et al. | 257/288 |
| 2009/0140292 | A1* | 6/2009 | Liu et al. | 257/190 |
| 2009/0166676 | A1* | 7/2009 | Lee et al. | 257/192 |
| 2009/0321841 | A1* | 12/2009 | Hoentschel et al. | 257/369 |
| 2010/0022061 | A1* | 1/2010 | Wu et al. | 438/301 |
| 2010/0044761 | A1* | 2/2010 | Sultan et al. | 257/288 |
| 2010/0065913 | A1* | 3/2010 | Lu et al. | 257/369 |
| 2010/0109088 | A1* | 5/2010 | Ng et al. | 257/369 |
| 2010/0164004 | A1* | 7/2010 | Chatterjee et al. | 257/369 |
| 2010/0285643 | A1* | 11/2010 | Lee et al. | 438/232 |
| 2011/0057261 | A1* | 3/2011 | Choi | 257/334 |
| 2011/0171801 | A1* | 7/2011 | Sultan | 438/285 |
| 2011/0201165 | A1* | 8/2011 | Hoentschel et al. | 438/229 |
| 2011/0215376 | A1* | 9/2011 | Holt et al. | 257/192 |
| 2011/0223737 | A1* | 9/2011 | Liu et al. | 438/308 |
| 2011/0278646 | A1* | 11/2011 | Ng et al. | 257/192 |
| 2011/0284972 | A1* | 11/2011 | Lee et al. | 257/369 |
| 2011/0287600 | A1* | 11/2011 | Cheng et al. | 438/299 |
| 2011/0287611 | A1* | 11/2011 | Cheng et al. | 438/478 |
| 2011/0298049 | A1* | 12/2011 | Liang et al. | 257/344 |
| 2011/0303980 | A1* | 12/2011 | Sultan et al. | 257/347 |
| 2012/0012940 | A1* | 1/2012 | Liu et al. | 257/369 |
| 2012/0025329 | A1* | 2/2012 | Wu et al. | 257/411 |
| 2012/0038004 | A1* | 2/2012 | Satoh et al. | 257/384 |
| 2012/0043618 | A1* | 2/2012 | Lu et al. | 257/369 |

\* cited by examiner

SEMICONDUCTOR DEVICES HAVING STRESSOR REGIONS AND RELATED FABRICATION METHODS

TECHNICAL FIELD

Embodiments of the subject matter generally relate to semiconductor device structures and related fabrication methods, and more particularly, embodiments of the subject matter relate to devices and related fabrication methods for semiconductor devices having stressor regions.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

Epitaxial stressor regions are frequently used to increase the mobility of carriers in the channels of the MOS transistors, and thereby achieve a corresponding improvement in performance. However, as device geometries shrink (e.g., in 32 nm technologies and smaller technologies), non-uniformities and variations in the stressor regions at different locations across the wafer have a greater impact on transistor parameters, such as drive current, threshold voltage, and Miller capacitance. Non-uniformity across the wafer can potentially affect the yield, performance, and minimum operating voltage characteristics of the devices on the wafer.

BRIEF SUMMARY

A method is provided for fabricating a semiconductor device structure on an isolated region of semiconductor material. The method comprises forming a plurality of gate structures overlying the isolated region of semiconductor material and masking edge portions of the isolated region of semiconductor material. While the edge portions are masked, the fabrication method continues by forming recesses between gate structures of the plurality of gate structures and forming stressor regions in the recesses. The method continues by unmasking the edge portions and implanting ions of a conductivity determining impurity type into the stressor regions and the edge portions.

In one embodiment, an apparatus for a semiconductor device is provided. The semiconductor device comprises a region of semiconductor material, a region of insulating material bordering the region of semiconductor material, a plurality of gate structures formed overlying the region of semiconductor material, and one or more stressor regions formed in the region of semiconductor material. Each stressor region is disposed between gate structures of the plurality of gate structures, and each outer gate structure of the plurality of gate structures is adjacent to a single stressor region.

In another embodiment, another apparatus for a semiconductor device is provided. The semiconductor device comprises a region of semiconductor material having a first conductivity type, an isolation region about the periphery of the region of semiconductor material, a stressor region formed in the region of semiconductor material, and a first gate structure formed overlying the region of semiconductor material. A first source/drain region having a second conductivity type is formed in a first portion of the region of semiconductor material disposed between the first gate structure and the isolation region, and the first source/drain region being adjacent to a channel region underlying the first gate structure. A second source/drain region having the second conductivity type is formed in the stressor region, and the second source/drain region is also adjacent to the channel region underlying the first gate structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to fabricate multi-finger semiconductor devices that include a plurality of MOS transistor device structures formed on a common isolated region of semiconductor material (which may also be referred to as an active region). Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of semiconductor devices are well known and so, in the interest of brevity, many conventional steps will only be mentioned briefly herein or will be omitted entirely without providing the well known process details.

Figure 1:
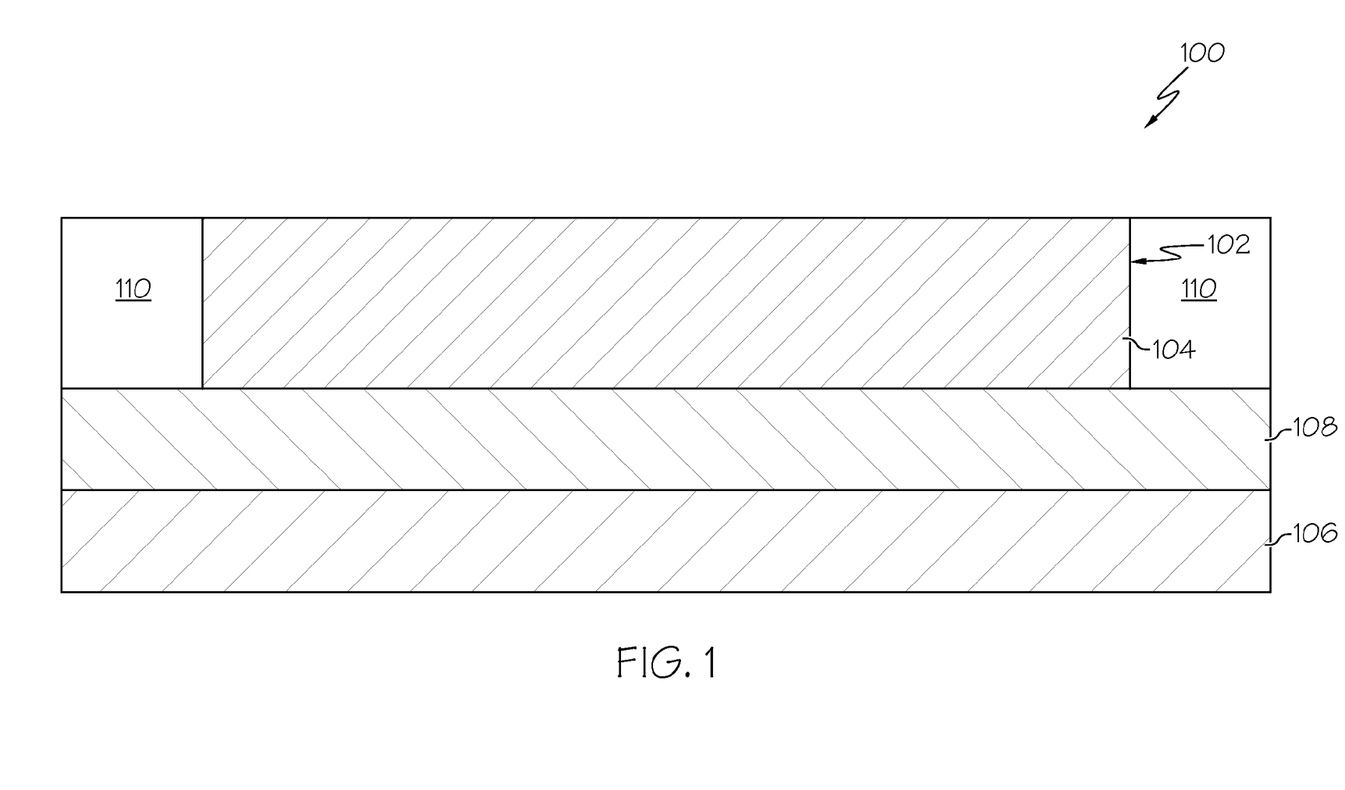
FIGS. 1-11 are cross-sectional views and top views that illustrate a semiconductor device structure and methods for fabricating the semiconductor device structure in exemplary embodiments.
Figure 2:
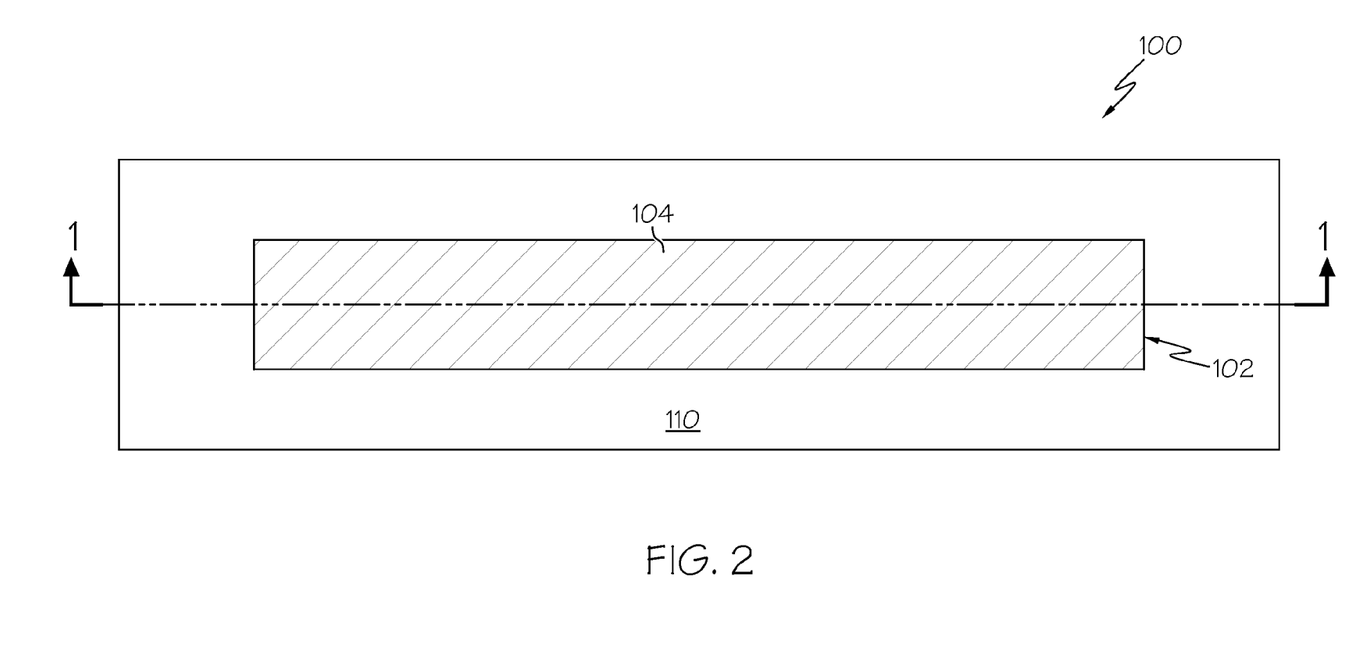

Referring now to FIG. 1 and FIG. 2, in an exemplary embodiment, the fabrication process begins by providing an appropriate semiconductor substrate and forming an electrically isolated region 102 of semiconductor material 104. FIG. 2 depicts a top view of a semiconductor device structure 100 after forming a region of insulating material 110 to electrically isolate a region 102 of semiconductor material 104, and FIG. 1 depicts a cross-sectional view of the semiconductor device structure 100 of FIG. 2 along the line 1-1. The isolated region 102 (which may also be referred to as an active region) may be utilized to form a multi-finger semiconductor device that is electrically isolated from other semiconductor devices (not shown) that may be formed on the same semiconductor substrate (or wafer).

Depending on the embodiment, the semiconductor substrate may be realized as a silicon-on-insulator (SOI) substrate or a bulk semiconductor substrate. The illustrated embodiment in FIG. 1 depicts a SOI substrate comprising a support layer 106, a layer of insulating material 108 on the support layer 106, and a layer of semiconductor material 104 on the layer of insulating material 108. It should be appreciated that in alternative embodiments, when the fabrication process described herein is used to create devices from a bulk semiconductor substrate, the support layer 106 and/or insulating material 108 need not be present. The insulating material 108 may be realized as an oxide layer formed in a subsurface region of the semiconductor substrate, also known as a buried oxide (BOX) layer. For example, the layer of insulating material 108 may be formed by an ion implantation process followed by high temperature annealing to create a buried layer of silicon dioxide. In other embodiments, an oxidized wafer may be bonded to the support layer 106 from a donor wafer to obtain the layer of insulating material 108 between the support layer 106 and a layer of semiconductor material 104 overlying the layer of insulating material 108. In an exemplary embodiment, the semiconductor material 104 overlying the insulating material 108 comprises a silicon material, wherein the term "silicon material" is used herein to encompass the relatively pure silicon materials typically used in the semiconductor industry as well as silicon admixed with other elements such as germanium, carbon, and the like. Alternatively, the semiconductor material 104 can be realized as germanium, gallium arsenide, and the like, or the semiconductor material 104 can include layers of different semiconductor materials.

In an exemplary embodiment, the electrically isolated region 102 is formed by performing shallow trench isolation (STI) on the semiconductor substrate, resulting in a region of an insulating material 110 about the periphery of the isolated semiconductor region 102. The shallow trench isolation may be formed in a conventional manner, for example, by forming a masking material, such as a nitride material (e.g., the pad nitride), overlying the semiconductor material 104, patterning the masking material to leave exposed portions of the underlying semiconductor material 104, etching trenches into the exposed portions of the semiconductor material 104 using the masking material as an etch mask, and forming the insulating material 110 in the trenches to electrically isolate region 102. It should be appreciated that although the subject matter is described herein in the context of shallow trench isolation, in practice, the electrically isolated region 102 may be formed using another isolation process (e.g., local oxidation of silicon) known in the art.

In the illustrated embodiment of FIG. 1, the trenches are etched to a depth at least equal to the thickness of the layer of semiconductor material 104. In this regard, the trenches are etched to a depth that exposes the underlying insulating material 108. After forming trenches, a layer of insulating material 110 is formed in the trenches by conformably depositing a layer of an oxide material, such as silicon dioxide, to a thickness greater than the depth of the trenches relative to the upper surface of the semiconductor material 104. After forming the oxide material 110 in the trenches, chemical-mechanical planarization (CMP) may be used to remove any oxide material 110 overlying the isolated region 102 and obtain a substantially planar surface, resulting in the semiconductor device structure 100 shown in FIGS. 1-2. In this regard, the oxide material 110 is uniformly removed until reaching the pad nitride, that is, the planarization is stopped when the upper surface of the pad nitride is exposed. The remaining oxide material 110 may hereinafter be referred to for convenience, but without limitation, as the field oxide. As shown in FIG. 2, the field oxide 110 borders the perimeter of the isolation region 102.

Although not illustrated in FIG. 1, in practice, the sidewalls of the trenches used for the field oxide 110 may be tapered in a conventional manner to reduce stress developing at the upper surface of the semiconductor region 102 and/or to facilitate a void-free filling of the oxide material 110 in the trenches. Additionally, other cleaning process steps performed after the CMP (e.g., removal of the pad nitride and/or pad oxide) may result in divot regions in the field oxide 110 at or near the boundaries to the semiconductor region 102. As a result, in practice, the boundaries between the field oxide and the semiconductor material exhibit variations and non-uniformities across the wafer. This results in corresponding variations and non-uniformities in the epitaxial growth of stress-inducing semiconductor material in recesses at the edges of the semiconductor material along the boundaries of the field oxide, as described in greater detail below.

In an exemplary embodiment, after electrically isolating the region 102 of semiconductor material 104, the fabrication process continues by implanting ions into the isolated semiconductor region 102 to achieve a desired dopant profile for the channel regions of MOS transistor structures subsequently formed on the isolated semiconductor region 102. For example, an N-well may be formed in the isolated semiconductor region 102 by implanting N-type ions, such as arsenic and/or phosphorus ions, into the semiconductor material 104. Alternatively, a P-well may be formed by implanting P-type ions, such as boron ions, into the semiconductor material 104. These ion implantation steps may include several different, separate implantations at different energies and different doses to achieve a desired doping profile, as will be appreciated in the art.

Figure 3:
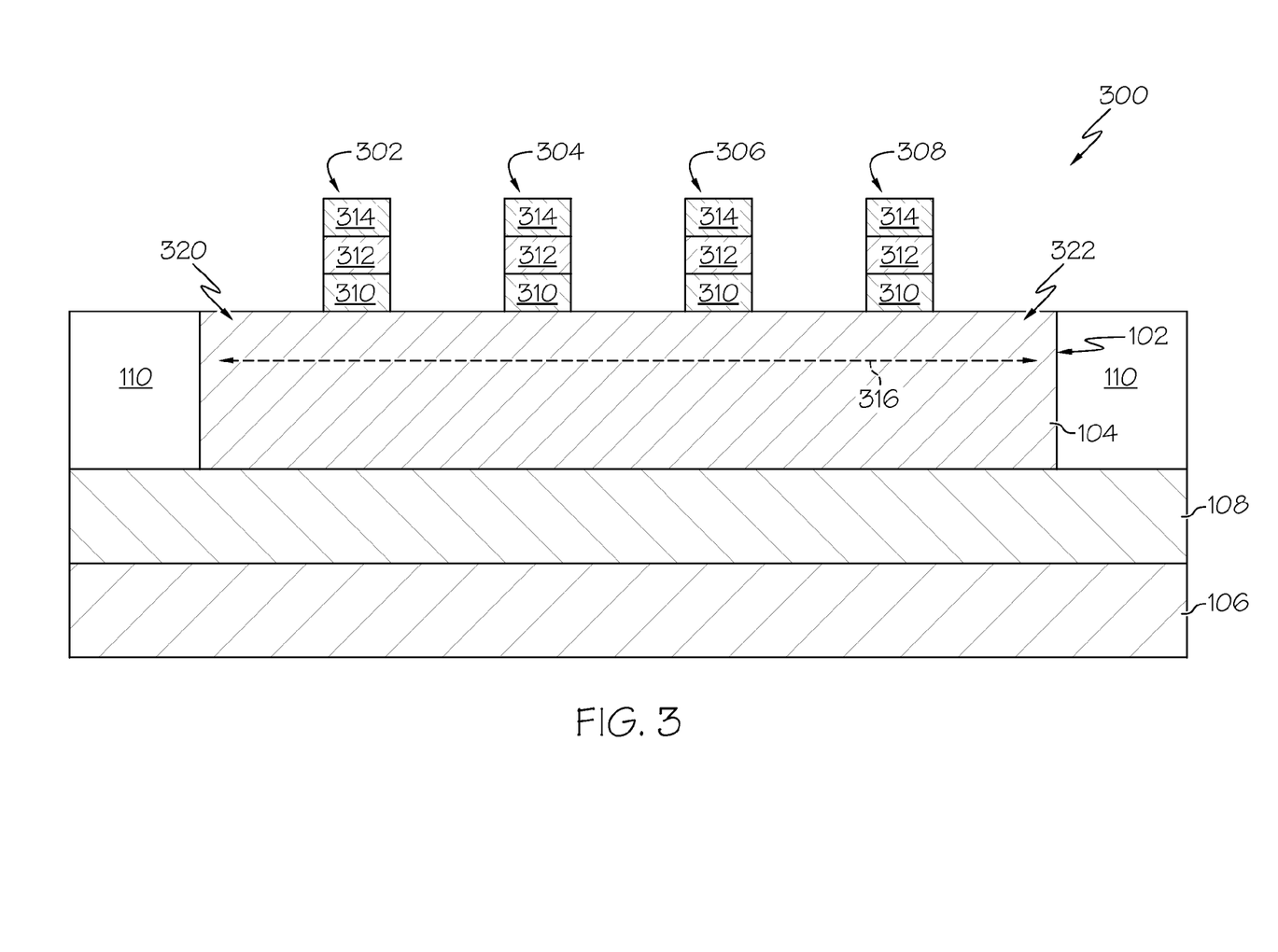
Figure 4:
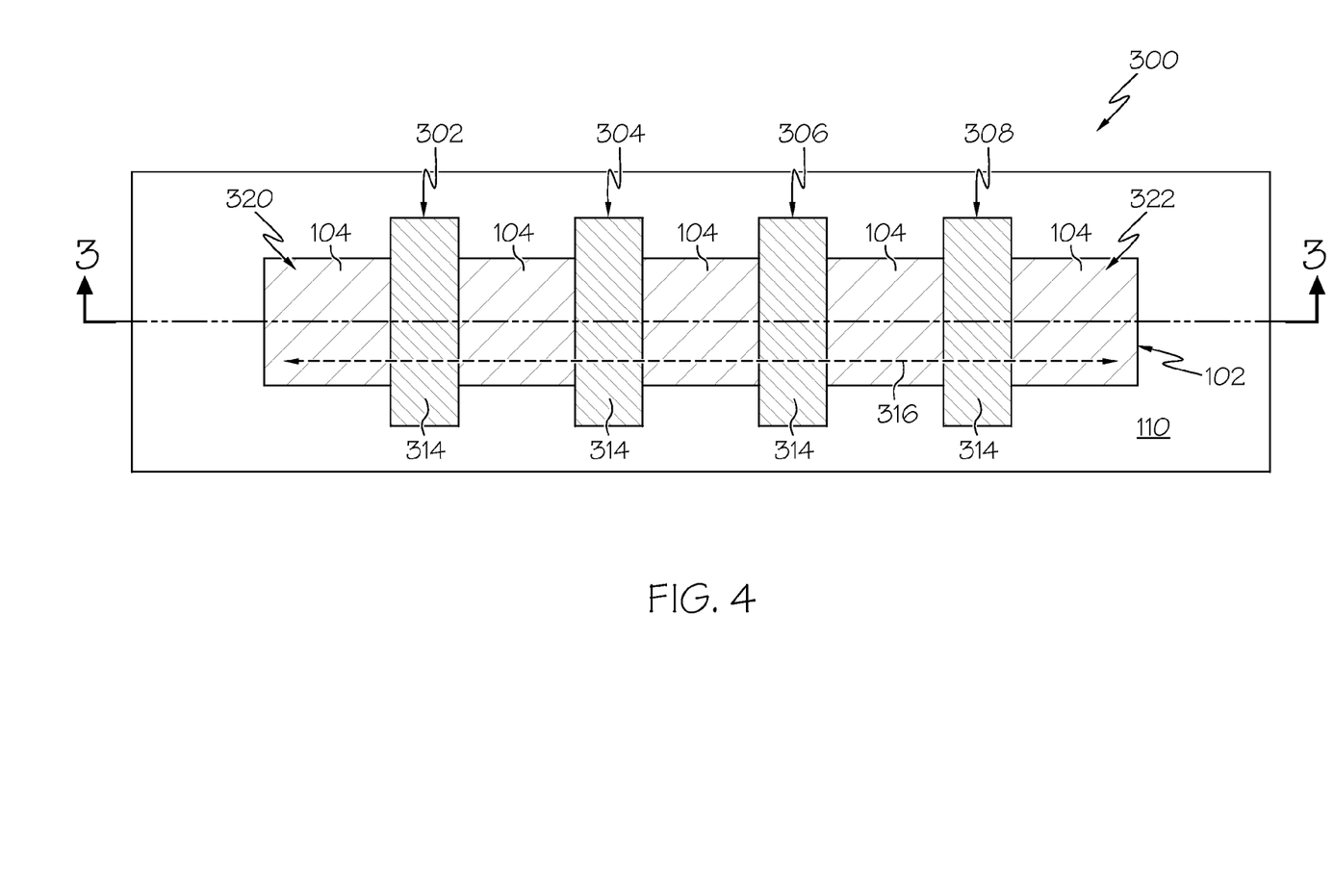

Referring now to FIG. 3 and FIG. 4, although one or more additional process steps may be performed next, in an exemplary embodiment, the fabrication of a multi-finger semiconductor device continues by forming a plurality of gate structures (or gate stacks) 302, 304, 306, 308, overlying the isolated region 102 of semiconductor material 104, resulting in the semiconductor device structure 300. FIG. 3 depicts a cross-sectional view of the semiconductor device structure 300 of FIG. 4 along the line 3-3. Each gate structure 302, 304, 306, 308 corresponds to a finger of the multi-finger semiconductor device and functions as a gate electrode for a MOS transistor structure subsequently formed on the isolated region 102. In this regard, the plurality of gate structures 302, 304, 306, 308 may be collectively referred to as a multi-finger gate structure. Although FIGS. 3-4 depict four gate structures formed overlying the isolated semiconductor region 102, in practice, any number of gate structures may be formed on the isolated semiconductor region 102, and the subject matter is not intended to be limited to any particular number of gate structures formed on the isolated region of semiconductor material.

The gate structures 302, 304, 306, 308 can be created using a conventional gate stack module or any combination of well-known process steps. As best shown in FIG. 3, each gate structure 302, 304, 306, 308 comprises at least one layer of dielectric material 310, at least one layer of conductive material 312, and at least one layer of a capping material 314. For example, the gate structures 302, 304, 306, 308 may be formed by depositing one or more layers of dielectric material 310, such as an oxide material or a high-k dielectric material, overlying the semiconductor region 102. After forming the gate dielectric material 310, fabrication of gate structures 302, 304, 306, 308 may continue by depositing one or more layers of conductive gate electrode material 312, such as a metal material or polycrystalline silicon (polysilicon), overlying the layer(s) of dielectric material 310. After forming the gate electrode material 312, fabrication of gate structures 302, 304, 306, 308 may continue by depositing one or more layers of nitride material 314, such as silicon nitride, overlying the conductive material 312. Portions of the dielectric material 310, conductive material 312, and capping material 314, are selectively removed, preferably using an anisotropic etchant, to define the plurality of gate structures 302, 304, 306, 308. In this regard, the remaining portions of capping material 314 function as gate caps that protect the underlying conductive material 312 during subsequent process steps. It should be understood that various numbers, combinations and/or arrangements of materials may be utilized for the gate structures in a practical embodiment, and the subject matter described herein is not limited to any particular number, combination, or arrangement of gate material(s) in the gate structure.

As best shown in FIG. 4, in the illustrated embodiment, the widths of the gate structures 302, 304, 306, 308 are aligned substantially orthogonal to a longitudinal axis 316 of the isolated semiconductor region 102, such that the lengths of the gate structures 302, 304, 306, 308 are aligned substantially parallel to longitudinal axis 316. As shown, the width of each gate structure 302, 304, 306, 308 is greater than or equal to the width of the underlying portion of semiconductor material 104 such that the gate structures 302, 304, 306, 308 overlap portions of the field oxide 110. As described in greater detail below, stressor regions are formed in the inner portions of the isolated semiconductor region 102 that reside between neighboring gate structures 302, 304, 306, 308 of the multi-finger gate structure 302, 304, 306, 308, while edge portions 320, 322 of the semiconductor material 104 of semiconductor region 102 remain intact. As described in greater detail below, the stressor regions provide source and/or drain regions for MOS transistor structures subsequently formed on isolated region 102 while each edge portion 320, 322 provides a resistive region for a MOS transistor comprising an outer gate structure. As used herein, an outer gate structure refers to a gate structure of the plurality of gate structures that is adjacent to only one other gate structure of the plurality of gate structures, while an inner gate structure refers to a gate structure adjacent to at least two other gate structures. For example, in the illustrated embodiment, outer gate structure 302 is adjacent to only gate structure 304, and outer gate structure 308 is adjacent to only gate structure 306, while inner gate structure 304 is adjacent to gate structures 302, 306 and inner gate structure 306 is adjacent to gate structures 304, 308. In this regard, each respective edge portion 320, 322 of the semiconductor region 102 is disposed between an outer gate structure 302, 308 and the boundary of the field oxide 110. In other words, the edge portions 320, 322 are adjacent to only one gate structure of the plurality of gate structures. Thus, in the illustrated embodiment, a first longitudinal edge portion 320 is adjacent to the field oxide 110 and the first outer gate structure 302, and the upper surface of the edge portion 320 is circumscribed by the field oxide 110 and the first outer gate structure 302 (or alternatively, the portion of the isolated region 102 underlying gate structure 302). Similarly, the opposing longitudinal edge portion 322 is adjacent to the field oxide 110 and the second outer gate structure 308, and the upper surface of edge portion 322 is circumscribed by the field oxide 110 and the second outer gate structure 308 (or alternatively, the portion of the isolated region 102 underlying gate structure 308).

As best shown in FIG. 4, in an exemplary embodiment, the isolated region 102 and the gate structures 302, 304, 306, 308 are all substantially quadrilateral in shape, such that the longitudinal edge portions 320, 322 comprise substantially quadrilateral-shaped portions of semiconductor material 104 having three edges (or boundaries) that are adjacent to and in contact with the field oxide 110. In this regard, adjacent edges of the edge portions 320, 322 are in contact with the field oxide 110, and only one edge of the edge portions 320, 322 is adjacent to a gate structure of the plurality of gate structures 302, 304, 306, 308. Each inner portion of semiconductor material 104 between neighboring gate structures 302, 304, 306, 308 comprises a substantially quadrilateral-shaped portion of semiconductor material 104 having a first set of opposing edges (or boundaries) adjacent to gate structures of the plurality of gate structures and a second set of opposing edges (or boundaries) adjacent to and in contact with the field oxide 110. In the illustrated embodiment, the longitudinal edges of the inner portions of semiconductor material 104 are parallel to the longitudinal axis 316 and are adjacent to the field oxide 110, while the lateral edges of the inner portions of semiconductor material 104 are adjacent to gate structures of the plurality of gate structures 302, 304, 306, 308.

Figure 5:
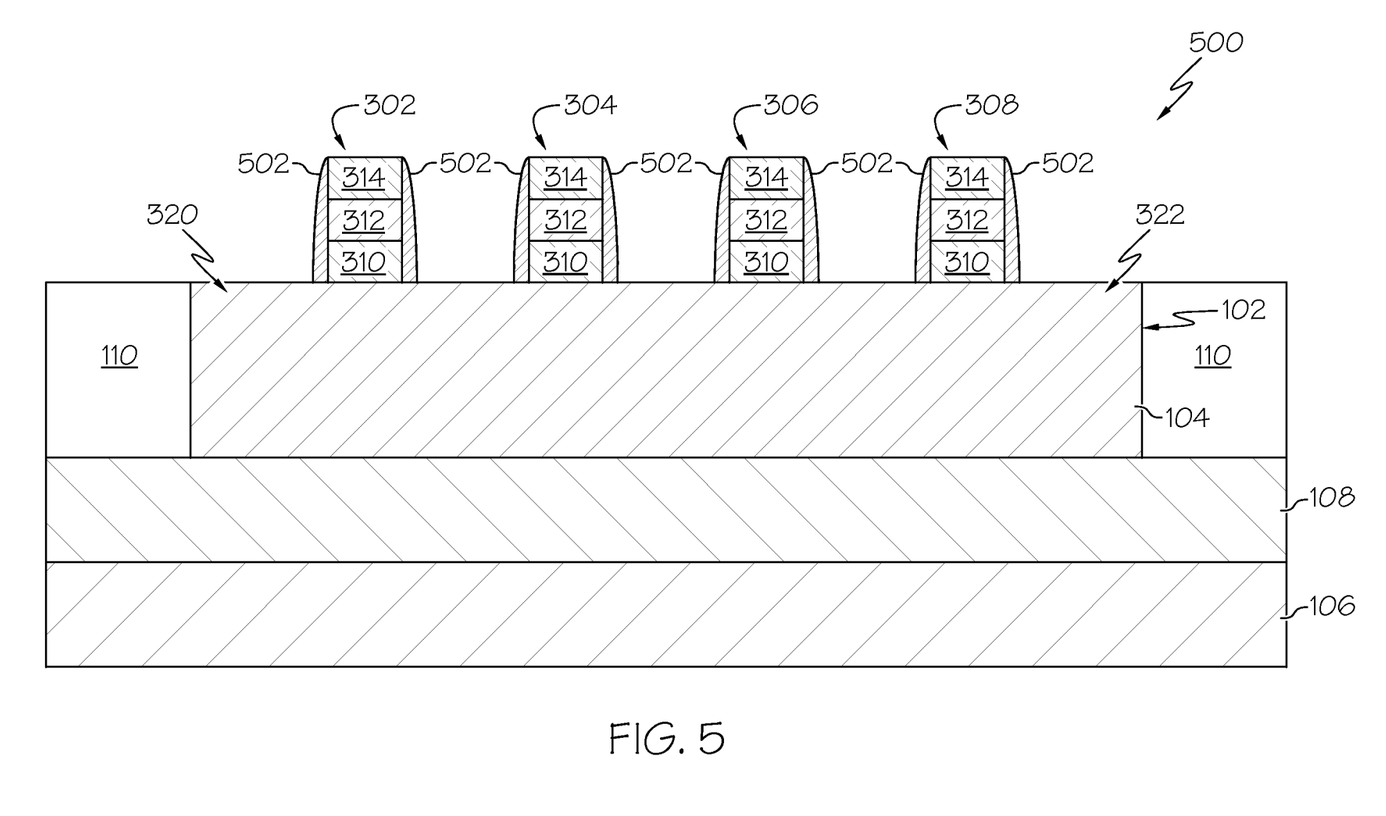

Referring now to FIG. 5, in an exemplary embodiment, the fabrication process continues by forming spacers 502 about sidewalls of the gate structures 302, 304, 306, 308, resulting in semiconductor device structure 500. The spacers 502 may be formed by forming a layer of insulating material overlying the gate structures 302, 304, 306, 308 and selectively removing portions of the insulating material. The insulating material may be a nitride material, such as silicon nitride, or an oxide material such as silicon oxide that is conformably deposited overlying semiconductor device structure 300 of FIGS. 3-4 in a known manner by, for example, atomic layer deposition (ALD), chemical vapor deposition (CVD), low pressure chemical vapor deposition (LPCVD), sub-atmospheric chemical vapor deposition (SACVD), or plasma-enhanced chemical vapor deposition (PECVD). The insulating material is preferably deposited to a thickness chosen such that the width of the portions of the spacers 502 in contact with the semiconductor region 102 is preferably within the range of about 10 nm to about 50 nm. The spacers 502 are preferably formed by anisotropically etching the insulating material using processes well known in the art. For example, spacers 502 formed from a silicon nitride material may be created using plasma-based RIE (reactive ion etching), using commonly known etchant chemistries.

Figure 6:
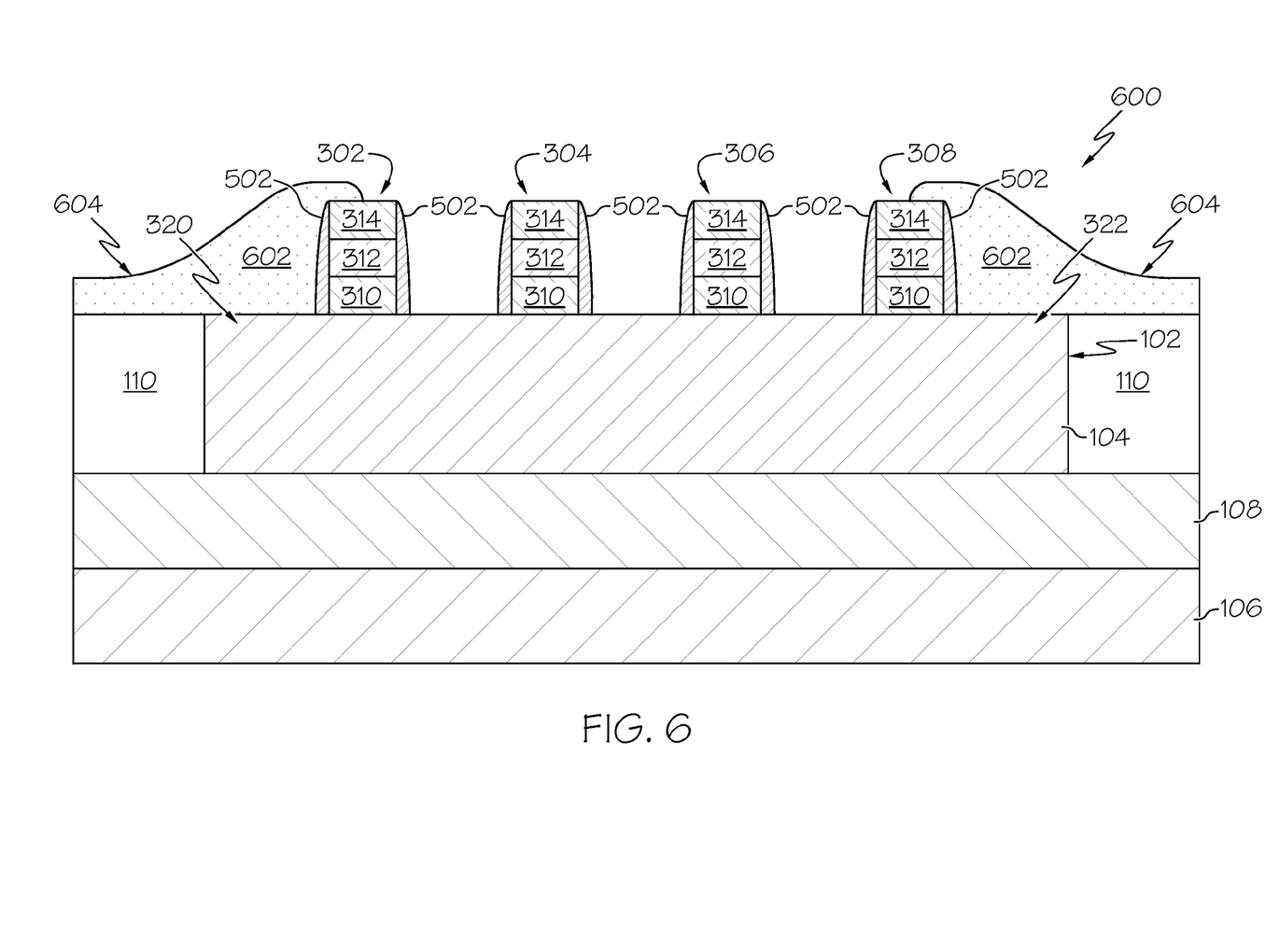
Figure 7:
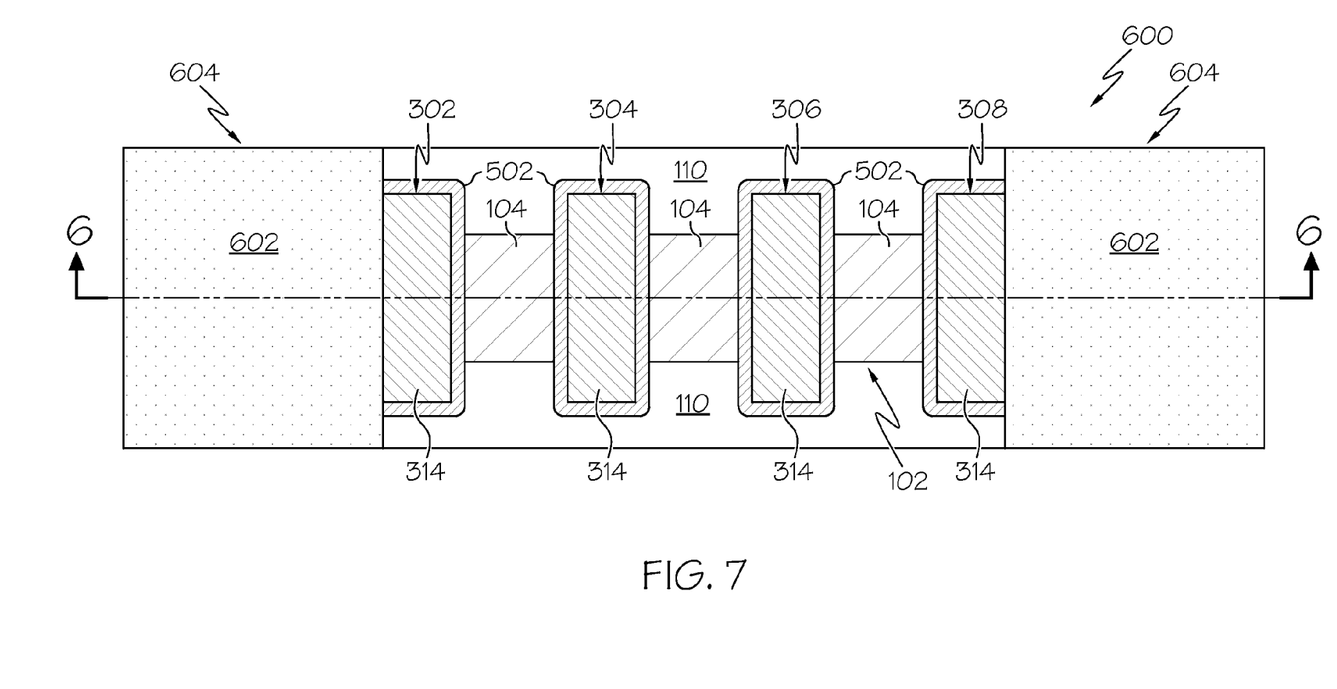

Referring now to FIGS. 6-7, in an exemplary embodiment, the fabrication process continues by masking the edge portions 320, 322 of the semiconductor region 102, that is, the portions of the isolated region 102 that are disposed between outer gate structures 302, 308 and the field oxide 110. In this regard, the fabrication process continues by forming a layer of masking material 602 overlying the semiconductor device structure 500 and selectively removing portions of the masking material 602 to define a mask 604 overlying the edge portions 320, 322, resulting in the semiconductor device structure 600 of FIGS. 6-7. FIG. 7 depicts a top view of the semiconductor device structure 600 and FIG. 6 depicts a cross-sectional view of the semiconductor device structure 600 of FIG. 7 along the line 6-6.

As best shown in FIG. 6, the mask 604 overlaps and/or overlies the edge portions 320, 322 of the semiconductor material 104 of the isolated semiconductor region 102 and at least a portion of the outer gate structures 302, 308 and the field oxide 110 bordering edge portions 320, 322. In accordance with one or more embodiments, the mask 604 is formed by conformably depositing a layer of a hard mask material 602, such as silicon nitride overlying the semiconductor device structure 500 of FIG. 5. A layer of photoresist is applied and patterned to mask the portions of the masking material 602 overlying edge portions 320, 322 of the semiconductor region 102 and at least the outer portions of the outer gate structures 302, 308 and the field oxide 110 bordering the edge portions 320, 322. The exposed portions of the masking material 602 are removed by etching the masking material 602 with a suitable etchant chemistry using the photoresist as an etch mask, resulting in the semiconductor device structure 600. In an exemplary embodiment, a Boolean algorithm is employed to generate the mask overlying portions of semiconductor material 104 adjacent to a gate structure and having three edges that intersect the field oxide 110, that is, portions of semiconductor material 104 having three edges (or boundaries) that are adjacent to and in contact with the field oxide 110. In this manner, the mask 604 leaves exposed the inner portions of the semiconductor material 104 between neighboring gate structures 302, 304, 306, 308. As described in greater detail below, by masking edge portions 320, 322 of the isolated region 102, outer transistor structures formed overlying the isolated region 102 exhibit fewer variations that would otherwise be attributable to variations and/or non-uniformities of the boundaries between the field oxide 110 and semiconductor material 104, thereby improving yield.

Figure 8:
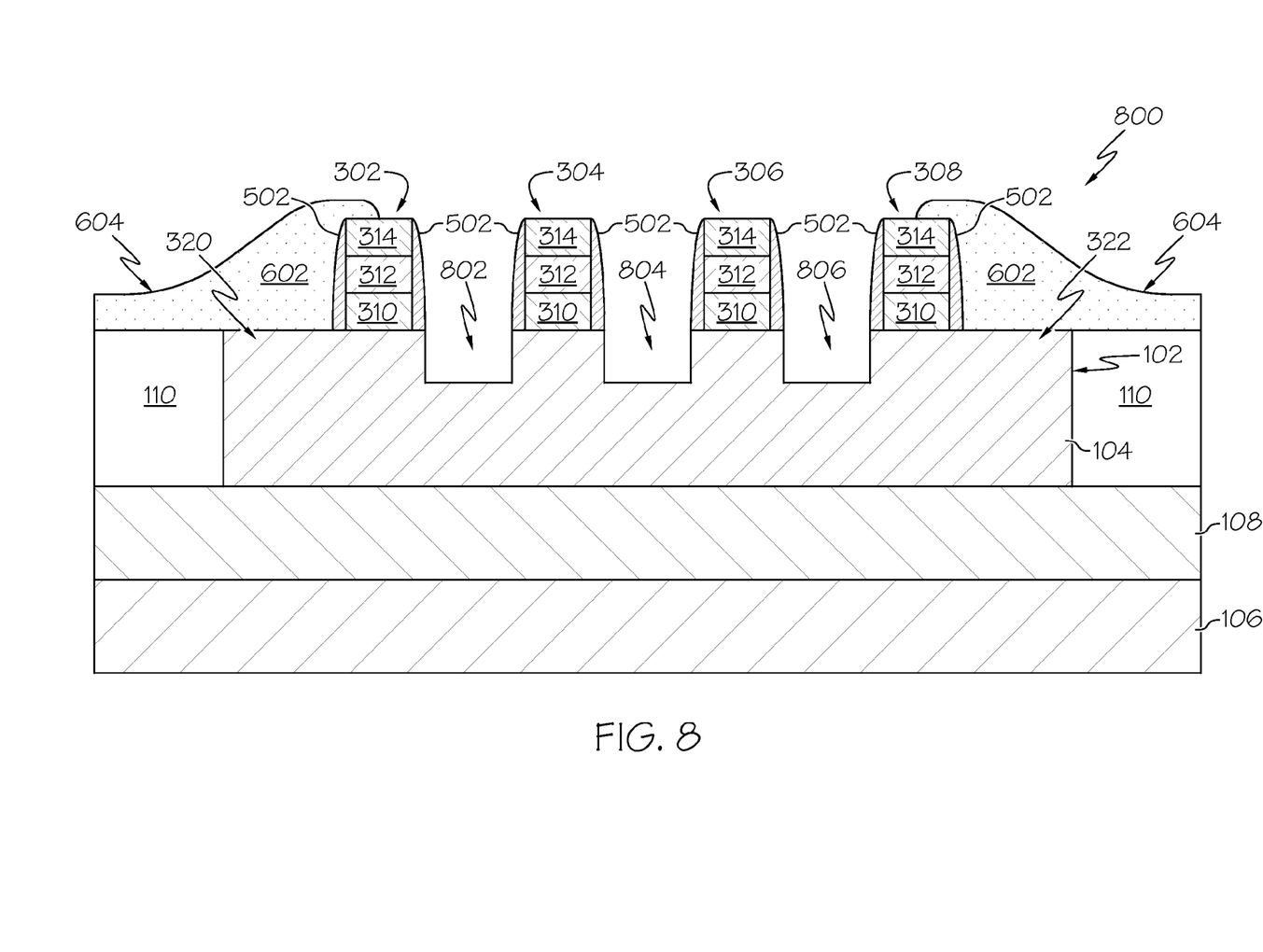

Referring now to FIG. 8, in an exemplary embodiment, the fabrication process continues by forming recesses (or cavities) 802, 804, 806 in the exposed inner portions of semiconductor material 104 of the isolated semiconductor region 102 that are between neighboring gate structures 302, 304, 306, 308, resulting in semiconductor device structure 800. The recesses 802, 804, 806 are preferably formed in the isolated semiconductor region 102 by anisotropically etching the exposed inner portions of semiconductor material 104 using the gate structures 302, 304, 306, 308, spacers 502, and masking material 602 as an etch mask. In this manner, the recesses 802, 804, 806 are formed between neighboring gate structures 302, 304, 306, 308 and vertically aligned with the spacers 502. In other words, the inward facing sidewalls of the recesses 802, 804, 806 are naturally formed such that they are aligned with the outward facing sides of the base of the spacers 502. For example, as best shown in FIG. 8, it appears as though the vertical sidewalls of spacers 502 continue downward to form the corresponding inward facing sidewalls of the recesses 802, 804, 806. The recesses 802, 804, 806 may be formed by anisotropically etching the exposed semiconductor material 104 using plasma-based RIE (reactive ion etching), using commonly known etchant chemistries such as, for example, $Cl_2+HBr$, $HBr+O_2$, or $Cl_2+HBr+O_2$, which have the advantage of etching silicon with good selectivity to the nitride material of the spacers 502, the mask 604, the gate cap 314, as well as any exposed field oxide 110. In an exemplary embodiment, the recesses 802, 804, 806 are formed having a depth relative to the surface of the semiconductor material 104 less than the thickness of the semiconductor material 104 such that the underlying insulating material 108 is not exposed. The depth of the recesses 802, 804, 806 relative to the surface of the semiconductor material 104 will vary depending on the needs of a particular embodiment.

Figure 9:
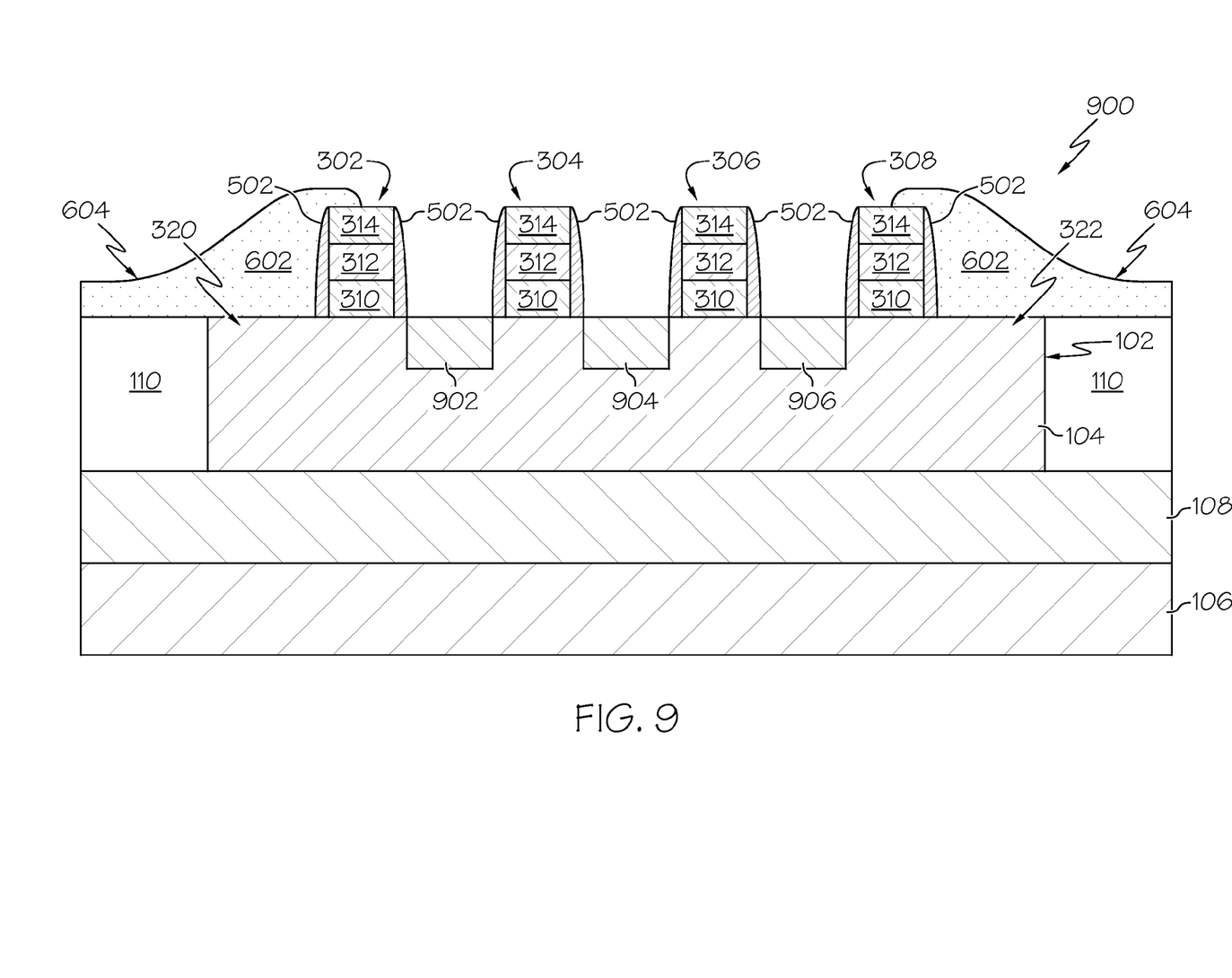

Referring now to FIG. 9, in an exemplary embodiment, the fabrication process continues by forming stressor regions 902, 904, 906 in the recesses 802, 804, 806 between neighboring gate structures 302, 304, 306, 308, resulting in semiconductor device structure 900. The stressor regions 902, 904, 906 are formed by growing a crystalline material having a different lattice constant than semiconductor material 104 on the exposed surfaces of the semiconductor material 104 in recesses 802, 804, 806. In an exemplary embodiment, the stressor regions 902, 904, 906 are formed by epitaxially growing a layer of stress-inducing semiconductor material in the recesses 802, 804, 806. For example, when the semiconductor material 104 is doped to provide an N-well for subsequently formed PMOS transistor structures, the stressor regions 902, 904, 906 are realized as a material having a larger lattice constant than semiconductor material 104, such as epitaxial silicon germanium (SiGe) (alternatively referred to as embedded SiGe or eSiGe). Embedded SiGe stressor regions 902, 904, 906 apply a compressive longitudinal stress to the channel regions of subsequently formed PMOS transistors (i.e., the portions of semiconductor material 104 underlying the gate structures 302, 304, 306, 308), which increases the mobility of holes in the channel regions. Similarly, when the semiconductor material 104 is doped to provide a P-well for subsequently formed NMOS transistor structures, the stressor regions 902, 904, 906 are realized as silicon carbon (or eSiC) or another a material having a smaller lattice constant than the semiconductor material 104 to apply a tensile longitudinal stress to the channel regions and thereby increase the mobility of electrons in the channel regions. The stress-inducing semiconductor material for the stressor regions 902, 904, 906 may be undoped or in-situ doped, depending on the needs of a particular embodiment.

The spacers 502, the mask 604, the gate cap 314, as well as any exposed field oxide 110 may act as a mask (i.e., selective epitaxy) that prevents or otherwise inhibits epitaxial growth on the surface of the gate structures 302, 304, 306, 308 and edge portions 320, 322. In this regard, the recesses 802, 804, 806 and/or spacers 502 define the boundaries of the stressor regions 902, 904, 906. Preferably, the stress-inducing semiconductor material for the stressor regions 902, 904, 906 is grown to at least the thickness of the recesses 802, 804, 806 (e.g., a "flush" fill or slight overfill). The stressor regions 902, 904, 906 occupy space within the isolated region 102 previously occupied by the inner portions of semiconductor material 104 between neighboring gate structures 302, 304, 306, 308. Thus, in a similar manner as described above in the context of FIG. 4, when the isolated region 102 and the gate structures 302, 304, 306, 308 are all substantially quadrilateral in shape, each stressor region 902, 904, 906 comprises a substantially quadrilateral-shaped portion of stress-inducing semiconductor material having a first set of opposing edges (or boundaries) adjacent to gate structures of the plurality of gate structures 302, 304, 306, 308 and a second set of opposing edges (or boundaries) adjacent to and in contact with the field oxide 110.

After forming stressor regions 902, 904, 906, the fabrication process preferably continues by unmasking the edge portions 320, 322 of the semiconductor material 104. When the mask 604 comprises a nitride material, the masking material 602 is removed by plasma-based reactive ion etching (RIE) or chemical etching with commonly known etchant chemistries, such as hydrogen bromide or a fluorine-based chemistry. Since the entire wafer is exposed to the etchant chemical, this may also result in simultaneous removal of the gate caps 314. By virtue of the removal of the gate caps 314, the conductive gate electrode material 312 may be doped during subsequent ion implantation. In some embodiments, the sidewall spacers 502 may comprise the same material as masking material 602 and be removed as part of the same etch step that removes the mask 604. In other embodiments, the sidewall spacers 502 comprise a material that is resistant to the etchant used to remove masking material 602, such that the sidewall spacers 502 are retained.

Figure 10:
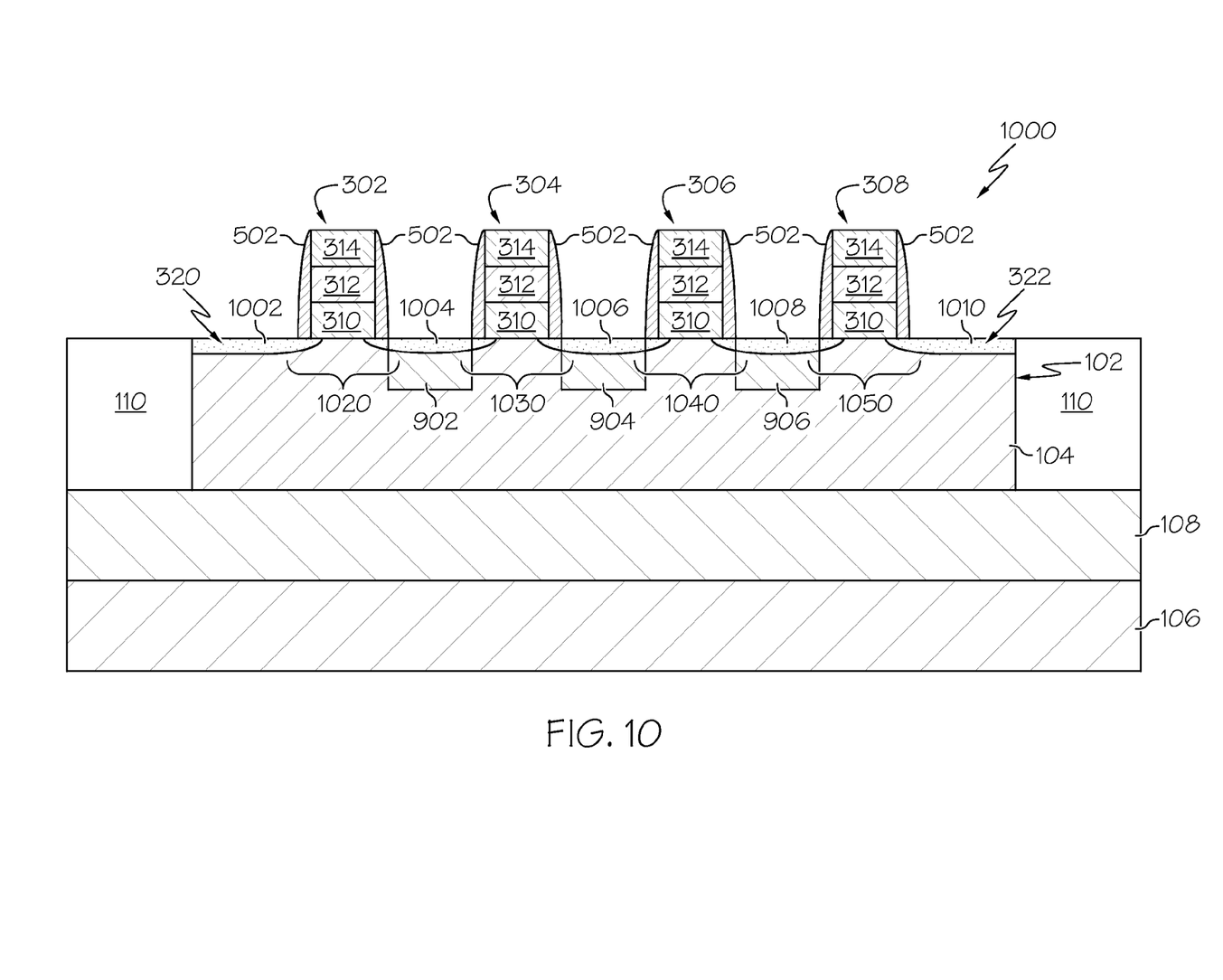
Figure 11:
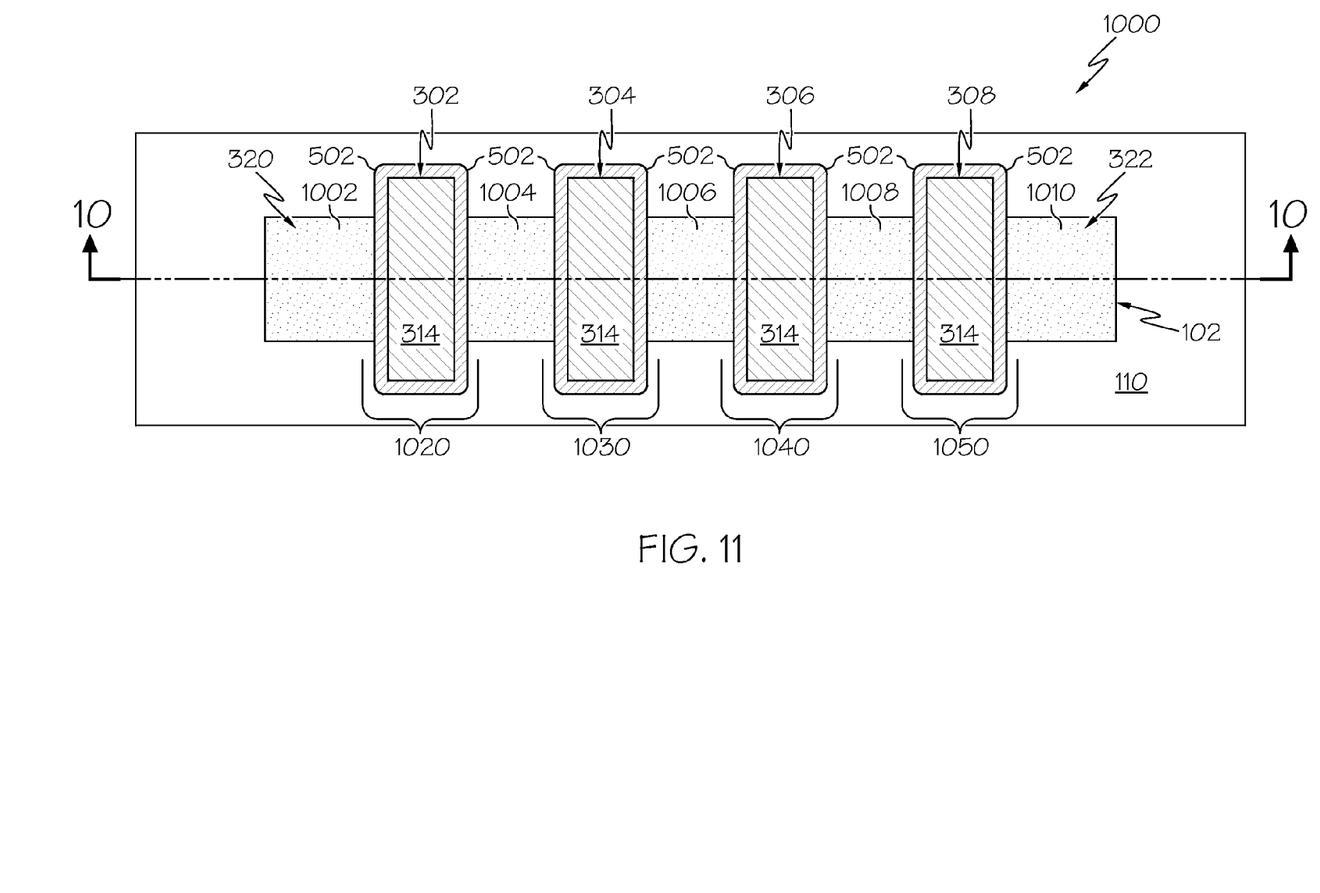

Referring now to FIGS. 10-11, after forming the stressor regions 902, 904, 906 in the recesses 802, 804, 806, in an exemplary embodiment, the fabrication process continues by implanting ions of a conductivity-determining impurity type (or dopant ions) into the stressor regions 902, 904, 906 and the edge portions 320, 322 of semiconductor material 104 using the gate structures 302, 304, 306, 308 as implantation mask to form spaced-apart source and drain regions 1002, 1004, 1006, 1008, 1010, resulting in semiconductor device structure 1000. FIG. 10 depicts a cross-sectional view of the semiconductor device structure 1000 of FIG. 11 along the line 10-10.

As described above, the edge portions 320, 322 are unmasked before implanting ions to form the source and drain regions 1002, 1004, 1006, 1008, 1010. Depending on the embodiment, before performing the ion implantation step, the sidewall spacers 502 may also be removed or additional sidewall spacers (e.g., offset spacers) may be formed to define the boundaries of the subsequently formed source and drain regions. Thus, it will be appreciated that although FIGS. 10-11 depict spacers 502 as being retained about the sidewalls of the gate structures 302, 304, 306, 308, various alternative implementations exist for defining the boundaries of the source and drain regions 1002, 1004, 1006, 1008, 1010 and the subject matter is not intended to be limited to a particular manner for defining the boundaries of the source and drain regions.

The source and drain regions 1002, 1004, 1006, 1008, 1010 are formed by implanting ions of a conductivity-determining impurity to a desired depth and/or sheet resistivity using the gate structures 302, 304, 306, 308, the spacers 502, and the field oxide 110 as an implantation mask. It will be appreciated that the depth of the ion implantation and/or resistivity of the source/drain regions will vary depending on the needs of the particular circuit or functionality being implemented with by the multi-finger semiconductor device 1000. The conductivity-determining impurity type of the implanted ions is of a conductivity type that is different from the conductivity type of the semiconductor material 104. For example, when the semiconductor material 104 is doped with N-type ions to provide an N-well region, the source and drain regions 1002, 1004, 1006, 1008, 1010 are formed by implanting P-type ions, such as boron ions or a boron ionized species, into the SiGe stressor regions 902, 904, 906 and the edge portions 320, 322 to form a plurality of PMOS transistor structures. Alternatively, when the semiconductor material 104 is doped with P-type ions to provide an P-well region, the source and drain regions 1002, 1004, 1006, 1008, 1010 are formed by implanting N-type ions, such as arsenic ions or phosphorous ions, into the SiC stressor regions 902, 904, 906 and the edge portions 320, 322 to form a plurality of NMOS transistor structures.

In the illustrated embodiment, a first outer transistor structure 1020 is comprised of outer gate structure 302 and spaced-apart source/drain regions 1002, 1004. The outer source/drain region 1002 is formed in the longitudinal edge portion 320 of unstressed (or unstrained) semiconductor material 104 that is bordered by the field oxide 110 and the channel region underlying the gate structure 302 and the inner source/drain region 1004 of the outer transistor structure 1020 is formed in the stressor region 902 adjacent to the gate structure 302. In this regard, the outer transistor structure 1020 is asymmetric and the mobility of carriers in the channel region underlying the gate structure 302 is only partially enhanced by the adjacent stressor region 902. As illustrated in FIG. 10, the upper surface of the source/drain region 1002 formed in the edge portion 320 is circumscribed by the field oxide 110 and the channel region underlying the gate structure 302. In a similar manner, the other outer transistor structure 1050 is comprised of outer gate structure 308 and spaced-apart source/drain regions 1008, 1010, wherein the outer source/drain region 1010 is formed in the unstressed (or unstrained) longitudinal edge portion 322 of semiconductor material 104 that is bordered by the field oxide 110 and the channel region underlying the gate structure 308 and the inner source/drain region 1008 is formed in the stressor region 906 adjacent to the gate structure 308. A first inner transistor structure 1030 is comprised of inner gate structure 304 having source/drain regions 1004, 1006 formed in the stressor regions 902, 904 adjacent to the inner gate structure 304, and a second inner transistor structure 1040 is comprised of inner gate structure 306 having source/drain regions 1006, 1008 formed in the stressor regions 904, 906 adjacent to the inner gate structure 306. In this manner, the inner transistor structures 1030, 1040 are symmetric and have stressor regions adjacent to their respective inner gate structures on both sides, such that the mobility of carriers in the channel regions of the inner transistor structures 1030, 1040 is enhanced by two stressor regions. The opposing longitudinal boundaries of the inner source/drain regions 1004, 1006, 1008 are adjacent to and in contact with the field oxide, while the other set of opposing boundaries of the inner source/drain regions 1004, 1006, 1008 are adjacent to a channel region underlying a respective gate structure 302, 304, 306, 308. As shown, in some embodiments, the inner source/drain regions 1004, 1008 of the outer transistor structures 1020, 1050 may be integrally formed with or otherwise contiguous with source/drain regions 1004, 1008 of the inner transistor structures 1030, 1040.

Thus, by virtue of masking the edge portions 320, 322 prior to forming stressor regions 902, 904, 906, the outer transistor structures 1020, 1050, that is, the transistor structures 1020, 1050 at longitudinal ends of the isolated semiconductor region 102, include one source/drain region formed in a stressor region 902 and a second source/drain region formed in the semiconductor material 104. In this regard, the outer transistor structures 1020, 1050 are asymmetric and the mobility of carriers in the channel regions underlying the outer gate structures 302, 308 is only partially enhanced by the stressor regions 902, 904, 906. However, the inner transistor structures 1030, 1040 achieve additional carrier mobility enhancements by having stressor regions 902, 904, 906 formed on both sides of their respective channel regions.

Fabrication of the multi-finger semiconductor device overlying the isolated semiconductor region 102 may be completed using well known final process steps, and other back end process steps, which will not be described in detail herein. For example, the fabrication of the multi-finger semiconductor device structure 1000 may by completed by performing additional processes, such as deep ion implantation, formation of conductive contacts overlying the source/drain regions and/or gate structures, and/or formation of electrical interconnections to/from one or more of the transistor structures, in a conventional manner.

To briefly summarize, one advantage of the devices and methods described herein is that the outer transistor structures of a multi-finger semiconductor device exhibit fewer variations or non-uniformities in drive current and other characteristics that would otherwise be attributable to the outer transistors and variations and/or non-uniformities in stressor regions formed between outer gate structures and the field oxide. For example, in practice, the boundaries between the field oxide and the semiconductor material exhibit variations across the wafer, including tapering and/or divots. This results in corresponding variations and non-uniformities in the epitaxial growth of stress-inducing semiconductor material in the recesses at the edges of the semiconductor material along the boundaries of the field oxide. Due to the topographical differences and/or crystallographic stress differences in the edge portions of semiconductor material relative to the inner portions of semiconductor material, the etching and epitaxial growth processes to form stressor regions may result in outer stressor regions for the outer transistor structures that are significantly different with respect to the stressor regions for the inner transistor structures, thereby producing variations and non-uniformities in the performance of the outer transistors relative to the inner transistors. In contrast, the characteristics of the stress-inducing semiconductor material in the inner stressor regions exhibit less variations and/or non-uniformities because the stress-inducing material is grown in recesses having at least two silicon sidewalls with substantially the same exposed surface area. Thus, by masking edge portions of the isolated regions of semiconductor material, the outer transistor structures of the multi-finger semiconductor devices described herein exhibit fewer variations, thereby improving yield, while the performance benefits inured by the stressor regions are retained for the inner transistor structures.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device structure on an isolated region of semiconductor material, the method comprising:
    forming a plurality of gate structures overlying the isolated region of semiconductor material, wherein each gate structure comprises a gate cap of capping material;
    masking edge portions of the isolated region of semiconductor material with a mask comprising a masking material that is the same as the capping material;
    while the edge portions are masked:
        forming recesses between gate structures of the plurality of gate structures; and
        forming stressor regions in the recesses;
    simultaneously unmasking the edge portions and the gate structures; and
    implanting ions of a conductivity-determining impurity type into the stressor regions and the edge portions.

2. The method of claim 1, wherein:
    the isolated region of semiconductor material is bordered by a region of insulating material; and
    masking edge portions of the isolated region of semiconductor material comprises forming a mask overlying portions of the isolated region of semiconductor material disposed between outer gate structures of the plurality of gate structures and the region of insulating material.

3. The method of claim 1, wherein masking edge portions of the isolated region comprises:
    forming a masking material overlying the isolated region of semiconductor material; and
    etching the masking material to obtain a mask overlying the edge portions of the isolated region, wherein the mask exposes portions of the isolated region of semiconductor material disposed between gate structures of the plurality of gate structures.

4. The method of claim 1, the isolated region comprising an N-type region of semiconductor material, wherein:
    forming the stressor regions comprises forming a stress-inducing semiconductor material comprising silicon and germanium in the recesses; and
    implanting ions comprises implanting P-type ions into the stress-inducing semiconductor material and the edge portions.

5. The method of claim 1, the isolated region comprising a P-type region of semiconductor material, wherein:
    forming the stressor regions comprises forming a stress-inducing semiconductor material comprising silicon and carbon in the recesses; and
    implanting ions comprises implanting N-type ions into the stress-inducing semiconductor material and the edge portions.

6. The method of claim 1, wherein the capping material and the masking material are a nitride material, and wherein simultaneously unmasking the edge portions and the gate structures comprises simultaneously etching the capping material and the masking material with an etchant.

7. A method of fabricating a multi-finger semiconductor device structure on an isolated region of semiconductor material, the method comprising:
    forming a plurality of gate structures overlying the isolated region of semiconductor material, wherein each gate structure corresponds to a finger of the multi-finger semiconductor device structure;
    masking edge portions of the isolated region of semiconductor material, wherein inner gate structures between the masked edges remain exposed and wherein gate structures at longitudinal ends of the isolated region of semiconductor material are at least partially masked;
    while the edge portions are masked:
        forming recesses between gate structures of the plurality of gate structures; and
        forming stressor regions in the recesses;
    unmasking the edge portions; and
    implanting ions of a conductivity-determining impurity type into the stressor regions and the edge portions, wherein ions are implanted in one stressor region on one side and ions are implanted in the semiconductor material on another side of the gate structures at longitudinal ends of the isolated region of semiconductor material, and wherein ions are implanted in stressor regions formed on both sides of inner gate structures.

* * * * *